United States Patent
Peng et al.

(10) Patent No.: US 7,043,991 B2
(45) Date of Patent: May 16, 2006

(54) DAMPER FOR A GAUGE SENSOR IN A DRY ETCH CHAMBER

(75) Inventors: Shun-Huang Peng, Hsinchu (TW);
Shih-Shiung Yang, Hsinchu (TW);
Chung-Chi Liang, Chung Li (TW);
Ming-Yi Huang, Tou Liu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/706,994

(22) Filed: Nov. 14, 2003

(65) Prior Publication Data

US 2005/0022604 A1   Feb. 3, 2005

(30) Foreign Application Priority Data

Jul. 28, 2003   (TW) ................. 92119702 A

(51) Int. Cl.
  *G01L 7/00* (2006.01)
(52) U.S. Cl. ........................................... 73/700
(58) Field of Classification Search ................. 73/700, 73/715–731, 861.52–861.64, 204.21, 204.22, 73/754, 756
See application file for complete search history.

(56) References Cited

U.S. PATENT DOCUMENTS

| | | | |
|---|---|---|---|
| 4,599,895 A * | 7/1986 | Wiseman | 73/204.18 |
| 4,981,035 A * | 1/1991 | Hall | 73/204.21 |
| 5,137,026 A * | 8/1992 | Waterson et al. | 73/861.52 |
| 5,163,322 A * | 11/1992 | Ohtani | 73/204.21 |
| 5,377,300 A * | 12/1994 | Collins et al. | 392/479 |
| 6,550,338 B1 * | 4/2003 | Rashidi | 73/715 |
| 6,550,868 B1 * | 4/2003 | Kobayashi et al. | 301/6.91 |
| 6,619,114 B1 * | 9/2003 | Lenzing et al. | 73/204.21 |
| 6,619,115 B1 * | 9/2003 | Lenzing et al. | 73/204.21 |
| 6,684,692 B1 * | 2/2004 | Lenzing et al. | 73/204.21 |
| 6,722,196 B1 * | 4/2004 | Lenzing et al. | 73/204.21 |
| 6,886,401 B1 * | 5/2005 | Ito et al. | 73/204.21 |
| 2003/0141227 A1* | 7/2003 | Fukui et al. | 210/87 |
| 2004/0118519 A1* | 6/2004 | Sen et al. | 156/345.33 |

* cited by examiner

*Primary Examiner*—Max Noori
(74) *Attorney, Agent, or Firm*—Troxell Law Office, PLLC

(57) ABSTRACT

A damper for protecting a gauge sensor measuring the pressure of a dry etch chamber. The damper includes a vacuum tube for connecting the gauge with the chamber and at least one plate for blocking the plasma of the chamber from directly striking against the sensor. The at least one plate is disposed at the inner wall of the vacuum tube to effectively prevent the plasma from attaching onto the sensor so as to maintain the sensitivity of the sensor and prolong the lifetime of the gauge.

8 Claims, 1 Drawing Sheet

DAMPER FOR A GAUGE SENSOR IN A DRY ETCH CHAMBER

FIELD OF THE INVENTION

The present invention relates to a gauge damper and, more specifically, to a damper for protecting a gauge sensor measuring the pressure of a dry etch chamber.

BACKGROUND OF THE INVENTION

For the fabrication of microelectronic devices such as light emitted diodes and flat panel displays, dry etch processing is used to selectively remove a patterned film material from the surface of a substrate. The dry etch process involves introduction of a gas into an etch chamber. The gas serving as the etch medium is excited by an applied electric field to generate a plasma. The plasma breaks down the gas into reactive species. Also, the plasma ionizes the gas, enhancing the mobility of the gas particles to transport to the substrate under the influence of the electric field. The gas ions strike the substrate surface, reacting with the specific film material to remove it from the substrate.

Please refer to FIG. 1, which is a schematic diagram of the relative position of a chamber 1 and a gauge 2 in a dry etcher. The chamber 1 is connected to the gauge 2 with a vacuum tube 3. The vacuum tube 3 is locked into the wall of the chamber 1 and is communicated with the window (not shown) of the chamber 1. Furthermore, a valve 21 is between the gauge 2 with the vacuum tube 3. When the valve 21 is opened, a sensor 22 at the front of the gauge 2 can read the pressure of the chamber 1.

As shown in FIG. 1, the plasma particles produced in the reaction in the dry etching chamber 1 directly strike against the sensor 22 whenever the valve 21 is opened and are gradually deposited on the sensor 22. After a period of time, the sensor 22 is so insensitive that the pressure of the chamber 1 cannot be accurately read and the quality of products is affected. In the current process, the sensor 22 must be frequently rectified and adjusted and even be replaced by a new one.

Therefore, the problem occurred in the gauge used to measure the pressure of the chamber of the dry etcher is desired to be solved so as to maintain the sensitivity of the gauge sensor and prolong the lifetime of the gauge.

SUMMARY OF THE INVENTION

An objective of the present invention is to provide a gauge damper used in a dry etch chamber. The gauge damper can block the plasma of the chamber from directly striking against the gauge sensor so as to maintain the sensitivity of the gauge sensor and prolong the lifetime of the gauge.

A damper for protecting a gauge sensor measuring the pressure of a dry etch chamber is disclosed in this invention. The damper is mounted in a vacuum tube which is used to connect the gauge with the chamber. The damper comprises at least one plate disposed at the inner wall of the vacuum tube. The at least one plate is used to block the plasma of the chamber from directly striking against the sensor so that the plasma is mainly deposited and attached to the at least one plate rather than the sensor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

A damper for protecting a gauge measuring the pressure of a dry etch chamber disclosed in this invention can block the plasma of the chamber from directly striking against the sensor of the gauge and effectively prevent the plasma from attaching onto the sensor so as to maintain the sensitivity of the sensor and prolong the lifetime of the gauge.

Figure 1:
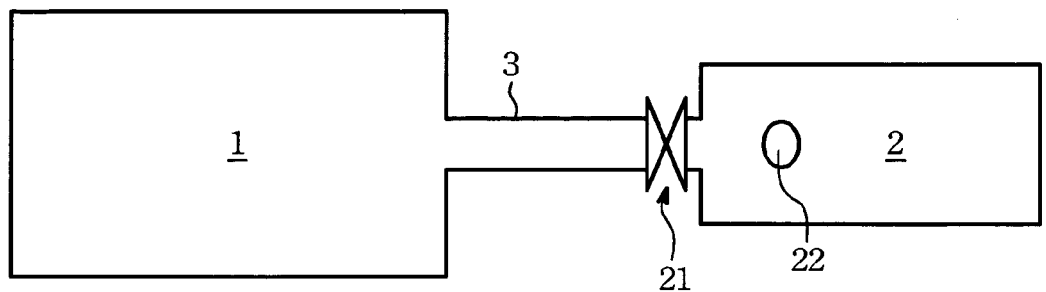
FIG. 1 is a schematic diagram of the relative position of a chamber and a gauge in a dry etcher in the prior art.
Figure 2:
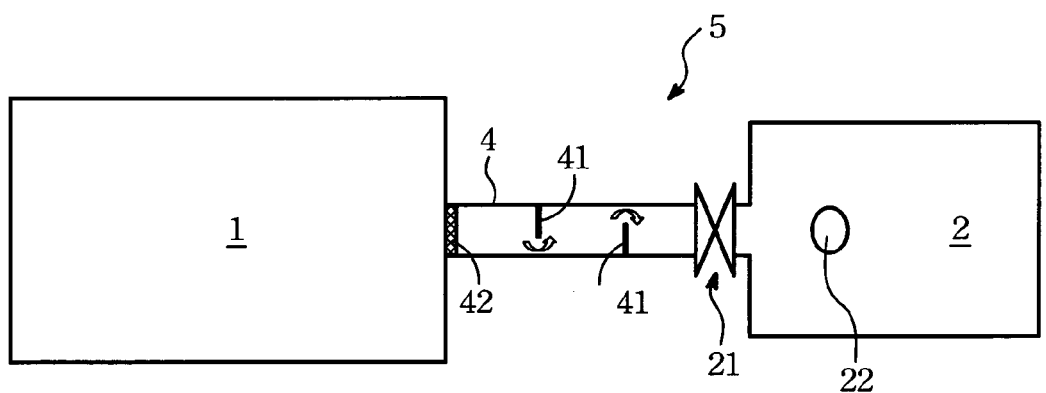
FIG. 2 is a schematic diagram of the structure and position of a gauge damper in accordance with a preferred embodiment of this invention.

Please refer to FIG. 2, which is a schematic diagram of the structure and position of a gauge damper in accordance with a preferred embodiment of this invention. The structure of the gauge damper 5 is formed by assembling at least one plate 41 such as a stainless steel plate in a vacuum tube 4 used to connect the gauge 2 with the chamber 1. The plasma particles flowing from the chamber 1 through the vacuum tube 4 are firstly deposited and attached onto the plate 41 and will not directly impact the sensor 22 of the gauge 2. Hence, the damper 5 has the buffer function. Two plates are exemplified in FIG. 2 and respectively mounted in a substantially vertical position at the upper inner wall and the lower inner wall of the vacuum tube 4 (perpendicular to the flowing plasma particles) such that the pathway of the plasma gas flowing from the chamber 1 through the vacuum tube 4 is of S shape as shown by the arrow and the buffer effect is enhanced.

Furthermore, a reticular structure 42 such as a wire netting is optionally disposed at the front end of the vacuum tube 4 near the chamber 1, at the front the first plate 41, in order to enhance the buffer effect of blocking the plasma from striking against and attaching to the sensor 22. The plates 41 and the reticular structure 42 may be disassembled from the vacuum tube 4 for cleaning.

The gauge damper 5 can protect the sensor 22 at the front of the gauge from being directly stricken against and considerably attached to by the plasma so that the frequency of the zero shift of the sensor in the prior art is reduced, the frequency of the maintenance of the gauge is also reduced and the lifetime of the gauge is prolonged. Moreover, the gauge damper 5 installed between the gauge 2 and the chamber 1 does not obviously affect the gauge 2 to read the pressure of the chamber 1. For the gauge damper having two stainless steel plates, the gauge 2 without such a damper 5 reads the pressure of the chamber 1 about in one second, and the gauge 2 with such a damper 5 reads the pressure of the chamber 1 about in from two to three seconds.

The number, disposition, shape and material of the plates in the damper of this invention may be appropriately modified according to practical requirements.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed:

1. A damper for protecting a sensor of a gauge measuring the pressure of a dry etch chamber, comprising:
   a vacuum tube for connecting a gauge with a chamber;
   at least one plate for blocking a plasma of the chamber from directly striking against a sensor, disposed substantially vertically at an inner wall of the vacuum tube; and
   at least one wire netting structure located on a front end of the vacuum tube near the chamber,
   wherein the plasma particles flowing from the chamber through the vacuum tube are firstly deposited and attached onto the plate and will not directly impact the sensor of the gauge.

2. The damper of claim 1, wherein the at least one plate is a stainless steel plate.

3. A damper for protecting a sensor of a gauge measuring the pressure of a dry etch chamber, comprising:
   a vacuum tube for connecting a gauge with a chamber; and two plates for blocking a plasma of the chamber from directly striking against a sensor, respectively and separately disposed substantially vertically at an upper inner wall and a lower inner wall of the vacuum tube,
   wherein the plasma particles flowing from the chamber through the vacuum tube are firstly deposited and attached onto the plate and will not directly impact the sensor of the gauge.

4. The damper of claim 3, further comprising a reticular structure disposed at the front end fo the vacuum tube near the chamber.

5. A damper for protecting a sensor of a gauge measuring a pressure of a dry etch chamber comprising:
   a) a vacuum tube connecting a gauge with a chamber; and
   b) at least one plate for blocking plasma particles of the chamber from directly striking against a sensor, disposed substantial vertically at an inner wall of the vacuum tube,
   wherein the plasma particles flowing from the chamber through the vacuum tube are firstly deposited and attached onto the plate and will not directly impact the sensor of the gauge.

6. The damper of claim 5, wherein the at least one plate is a stainless steel plate.

7. The damper of claim 5, further comprising a reticular structure located on a front end of an interior of the vacuum tube that is connected to the dry etch chamber.

8. The damper of claim 7, wherein the reticular structure is a wire netting.

* * * * *